United States Patent [19]
Sroka

[11] Patent Number: 5,227,748
[45] Date of Patent: Jul. 13, 1993

[54] FILTER WITH ELECTRICALLY ADJUSTABLE ATTENUATION CHARACTERISTIC

[75] Inventor: Peter Sroka, Sandhurst, England

[73] Assignee: Technophone Limited, Surrey, England

[21] Appl. No.: 744,945

[22] Filed: Aug. 14, 1991

[30] Foreign Application Priority Data

Aug. 16, 1990 [GB] United Kingdom ............... 9018019

[51] Int. Cl.[5] .................................. H01P 1/205
[52] U.S. Cl. ................................. 333/207; 333/235
[58] Field of Search .......................... 333/202–207, 333/235, 174–176

[56] References Cited

U.S. PATENT DOCUMENTS

| | | | |
|---|---|---|---|
| 3,723,773 | 3/1973 | Adams et al. | 307/295 |
| 3,903,487 | 9/1975 | Maier | 333/177 |
| 4,268,809 | 5/1981 | Makimoto et al. | 333/207 X |
| 4,714,906 | 12/1987 | D'Albaret et al. | 333/202 |
| 4,721,932 | 1/1988 | West | 333/202 X |
| 4,799,034 | 1/1989 | Silverman et al. | 333/202 |
| 4,835,499 | 5/1989 | Pickett | 333/205 |
| 4,983,938 | 1/1991 | Sasaki et al. | 333/207 |

FOREIGN PATENT DOCUMENTS

| | | |
|---|---|---|
| 0350256 | 1/1990 | European Pat. Off. ........... 333/202 |
| 0364931 | 4/1990 | European Pat. Off. . |
| 0441500A2 | 8/1991 | European Pat. Off. . |
| 2945264 | 5/1981 | Fed. Rep. of Germany . |
| 0283101 | 11/1990 | Japan ................................ 333/222 |
| 1015283 | 12/1965 | United Kingdom . |
| 2213004 | 8/1989 | United Kingdom . |
| 2213005 | 8/1989 | United Kingdom . |

*Primary Examiner*—Robert J. Pascal
*Assistant Examiner*—Seung Ham
*Attorney, Agent, or Firm*—Perman & Green

[57] ABSTRACT

A tunable bandstop/bandpass filter particularly suitable for use in duplex applications where the transmit and receive bands are closely located, comprises two or more reactively coupled quarter wavelength resonators e.g. dielectric resonators. One end of each resonator is coupled to ground potential. The opposite (open-circuit) end of the resonators is coupled to adjacent resonators via coupling capacitors. Voltage controlled tuning means, e.g. a varactor and series connected capacitor, are coupled in parallel to the open circuit end of each of the resonators respectively. The stopband/passband of the filter can thus be adjusted by varying the voltage applied to the tuning means. Additionally, in the case of a bandpass filter a tunable zero (or "notch") may be introduced into the transmission response by including varactors coupled in series to the open-circuit end of the resonators.

24 Claims, 3 Drawing Sheets

FILTER WITH ELECTRICALLY ADJUSTABLE ATTENUATION CHARACTERISTIC

This invention relates to a filter for selectively attenuating/passing a range of radio frequency signals.

BACKGROUND OF THE INVENTION

Bandpass filters are filters which selectively pass signals within a certain frequency range. Signals outside this bandwidth are attenuated so that they do not interfere with the desired signal. On the other hand, bandstop filters are filters which selectively attenuate signals within a certain frequency range. Signals outside this bandwith are passed by the filter.

The receive bandpass filter used in a transceiver must be capable not only of passing the full range of receive frequencies, but must also provide attenuation of the power at the transmit frequency during full duplex operation so that the receiver can operate when the transmitter is switched on. If the rejection is too low, then the transmit signal can enter the receiver as noise. Therefore the bandpass filter used in the receiver must be of a high enough order to reject the top transmit frequency, whereas a signal at the bottom receive frequency must be passed with a viable insertion loss.

Similarly, the transmit bandstop filter used in the transceiver must be capable of passing the full spectrum of transmit frequencies, while also providing sufficient attenuation of noise power in the receive band. The bandstop filter used in the transmitter must be of a high enough order to reject the lowest receive frequency, whereas a signal at the highest transmit frequency must be passed with viable insertion loss.

In cellular radio telephone systems the separation between adjacent edges of the receive and transmit bandwidths may be relatively close. For example in the ETACS cellular system in operation in the United Kingdom the transmission bandwidth is 872–905 MHz and the receiver bandwidth is 917–950 MHz. In this case the separation between adjacent edges of the receive and transmit bands is 12 MHz.

The spectral separation between the edges of the receive and transmit bands clearly impacts on the filtering requirements. When this separation is low, as in ETACS, higher order filters are generally required to meet the more demanding filtering requirements.

Higher order filters generally have more poles and hence a more complex physical and electrical configuration. Consequently higher order bandpass filters tend to be both large in size and costly to manufacture. The high cost is an obvious disadvantage. The large size means that higher order filters are not compatible with portable transceiver apparatus where miniaturization is desirable.

A further disadvantage of higher order bandpass filters is the associated insertion loss. That is to say, the greater the amount of filtering of the undesired signal, the higher is the loss to the desired signal.

The Applicant has recognised that an alternative solution to using higher order filters is to use a tunable filter. The stopband/passband of the filter may be varied electronically to coincide with the channel currently being received. The passband of the filter is selected to occur at a fixed level above the transmission frequency, for example 45 MHz in the case of ETACS. The tunability gives the advantage that the required filtering performance can be achieved with a lower order filter.

U.S. Pat. No. 4,835,499 discloses a voltage tunable combine filter having five poles. This bandpass filter comprises five parallel resonators which are coupled electromagnetically. Tuning diodes, used to vary the filter's passband, are coupled to one end of each resonator. The resonators are DC isolated at the opposite ends of the resonators, which ends are RF grounded. However, this combine configuration is relatively large in size (bearing in mind that the length of the individual transmission lines is in the order of a quarter of the wavelength of the received signal) and therefore not conducive for inclusion in compact portable transceiver apparatus. Furthermore it is noted that the filter configuration disclosed in this U.S. patent comprises five poles, but does not include any specific means for generating a transmission zero (i.e. rejection band or "notch"). Indeed it would not be possible to introduce such zero-generating (i.e. attenuating) means in the structure envisaged therein.

European patent application EP-A-0,364,931 discloses a bandpass filter having a tunable attenuation pole. The filter comprises a plurality of parallel dielectric resonators formed in a monolithic block of dielectric material. Adjustment electrodes associated with each resonator are provided on one face of the dielectric block. Either the pitch of the resonators or the configuration of the adjustment electrodes can be varied to cause inductive or capacitive overcoupling thereby tuning an attenuation pole of the dielectric filter to a selected frequency outside the passband. A disadvantage of this filter is that the actual physical configuration (i.e. resonator spacing or electrode pattern) has to be altered for different frequency requirements. In other words, individual filters are designed to give specific filtering characteristics and they are not readily re-tunable.

Our European patent application EP-A-0,441,500 relates to a transceiver for a cellular telephone in which a notch filter tuned to the transmit frequency is coupled to the output of the first amplifier in the receiver. The notch filter may be tunable to vary the location of the notch.

SUMMARY OF THE INVENTION

According to the present invention there is provided a filter for selectively attenuating/passing a range of radio frequency signals, including at least two reactively coupled resonators, tuning means coupled to at least one of said resonators for adjusting the range of frequencies attenuated/passed by the filter, and means for applying a control signal to said tuning means, wherein the range of frequencies attenuated/passed by the filter is adjusted by said tuning means in response to the control signal applied thereto.

A bandstop/bandpass filter in accordance with the invention has the advantage not only that the same filter can be continuously tuned (and re-tuned) to alter the range of frequencies which are attenuated/passed simply by applying a control signal of an appropriate level, e.g. a control voltage, to the tuning means; but also that it can be made relatively small in size and is inexpensive to manufacture. A lower order filter (e.g. having only two of three poles) can be used to achieve satisfactory rejection of undesired frequencies with viable insertion loss even in situations where the receive and transmit bands are only narrowly separated. The tuning means suitably comprise respective variable capacitance diodes (varactors) coupled electrically in parallel with the respective resonators. A common control signal may be applied to each varactor, or each varactor may be individually controlled.

The individual resonator means are preferably in the form of respective transmission line devices, suitably, for example, coaxial dielectric resonators. Alternatively, helical, microstrip or strip line resonators may be used.

In a particular embodiment of a passband filter a transmission zero (or "notch") may be included below the passband in the filter response by coupling further capacitor means in series with one or more of the resonator means. Alternatively, if the capacitor means are substituted by inductor means, the transmission zero can be located above the passband.

The further capacitor means or inductor means may be adjustable by applying a control signal thereto whereby the frequency location of the zero (notch) may be varied.

BRIEF DESCRIPTION OF THE DRAWINGS

Embodiments of the invention will now be described, by way of example, with reference to the accompanying drawings, in which.

In the various Figures the same reference numerals are used to designate corresponding parts.

DESCRIPTION OF THE PREFERRED EMBODIMENTS OF THE INVENTION

Figure 1:
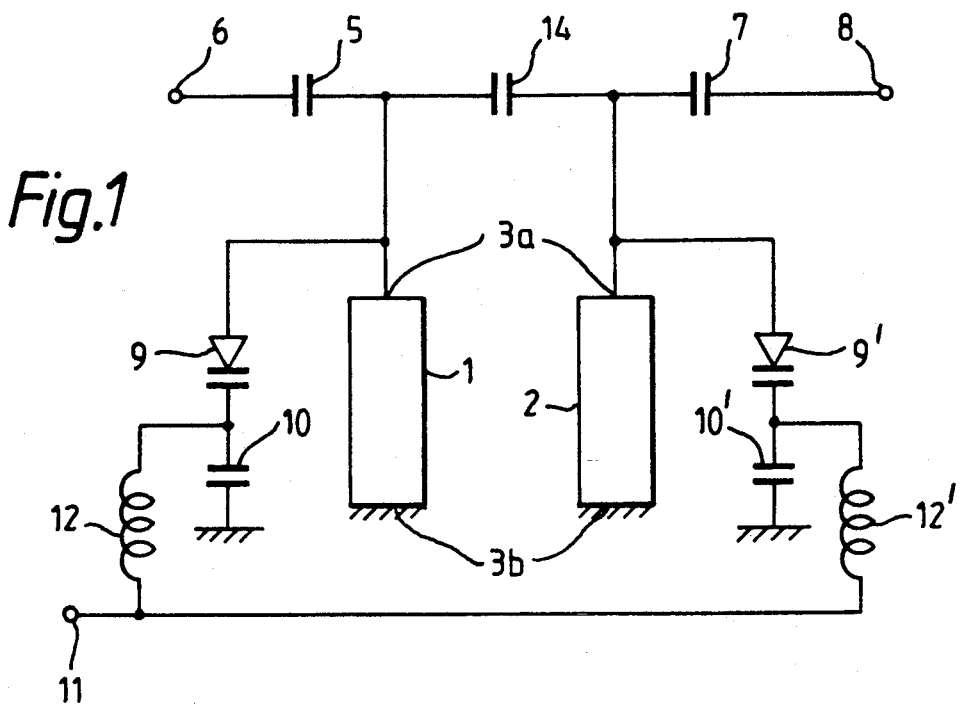
FIG. 1 is a circuit diagram of a two pole tunable bandpass filter in accordance with the invention.
Figure 2:
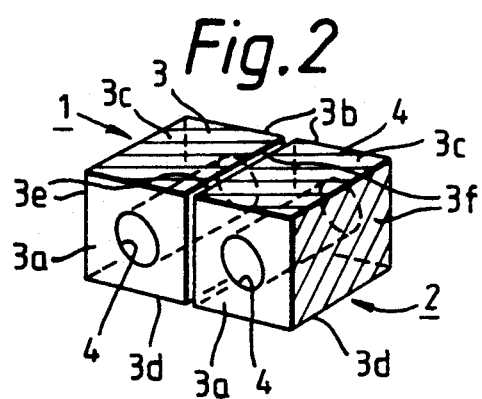
FIG. 2 is a schematic diagram of a pair of dielectric resonators used in the circuit of FIG. 1.
Figure 3:
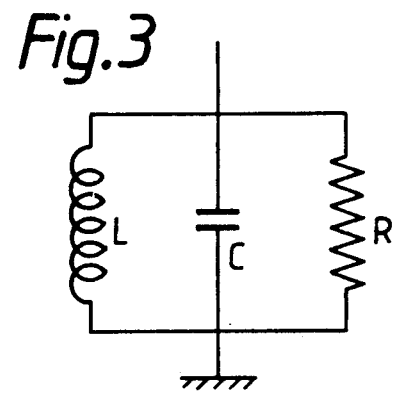
FIG. 3 is a diagram showing the equivalent circuit of one of the resonators in the circuit of FIG. 1.

A two pole passband filter is shown in the circuit diagram of FIG. 1 comprising two dielectric resonators 1 and 2. The dielectric resonators 1,2 for use in the 1 GHz range each comprise a quarter-wavelength short-circuited transmission line. The line is generally coaxial in configuration and is filled by a high permittivity dielectric material. As shown in FIG. 2, the two transmission lines are formed respectively by two discrete dielectric block resonators 1,2 disposed in contiguous relationship. Each resonator comprises a dielectric block 3 having a hole 4, for example circular in cross-section as shown, running through its centre extending from the front face $3a$ to the back face $3b$. The blocks 3 may be rectangular, as shown, or cylindrical. The bore of the hole 3 is metallised to form the inner coaxial line. The top and bottom faces $3c,3d$, the side faces $3e,3f$ and the back face $3b$ of the blocks 3 are also metallized. The rear face metallization thus constitutes the short-circuited end of the transmission line which is connected to ground potential, see FIG. 1. The front face $3a$ of the block is left unmetallized, forming an open circuit end. Electrical connection is made to the metallization on the bore of hole 3 at this open-circuited end $3a$ as shown in FIG. 1. If the dielectric material is chosen to have a permittivity of about 90 then the physical length of the quarter wavelength line is about 1 cm at 1 GHz, which thus provides a relatively compact resonator. Since the resonator is a short-circuited quarter wavelength line, then close to resonance it can be modelled as a parallel L C R resonant circuit as shown in FIG. 3. It can thus be seen that the effective capacitance of the resonator can be increased by the parallel connection of an additional capacitor, and if the capacitance of this additional capacitor can be varied as in the case of a varactor then the resonant frequency of the filter can be varied, as discussed in more detail below.

The end $3a$ of resonator 1 is connected via a 0.6 pF capacitor 5 to a signal input terminal 6 and the end $3a$ of resonator 2 is coupled via a similar 0.6 pF capacitor 7 to a signal output terminal 8.

The resonators are capacitively coupled by a 0.15 pF capacitor 14 connected between the respective open-circuited ends $3a$ of the two resonators 1 and 2.

In accordance with the present invention tuning means are connected in parallel to the open-circuit end of the resonators. To this end the anode of a first varactor 9 is coupled to the open-circuit end $3a$ of resonator 1, and the cathode of the varactor is connected to one terminal of a 10 pF capacitor 10. The other terminal of the capacitor 10 is connected to ground potential. The cathode of varactor 9 is also coupled to a DC control voltage input 11 via a 100 nH inductor 12. The inductor 12 helps to prevent any RF signal leaking to the input 11. The cathode of varactor 9 is RF grounded via capacitor 10.

The anode of a second varactor 9, is likewise coupled to the open-circuit end $3a$ of resonator 2 and the cathode of the varactor 9' is connected to one terminal of a 10 pF RF isolating capacitor 10'. The other terminal of the capacitor 10' is connected to ground potential. The cathode of varactor 9' is also coupled to the common DC voltage input 11 via a 100 nH inductor 12'. In an alternative arrangement the cathode of varactor 9' could be coupled to a separate voltage input so that varactors 9 and 9' can be controlled independently.

The Applicants have employed a Toshiba 1SV214 varactor as the varactors 9 and 9', which in the present circuit enabled the varactor voltage to be adjusted between 11.7 V to 25 V corresponding to a change in the equivalent resonator capacitance of 3 pF, and causing the filter response to be tunable over a 50 MHz range.

Figure 4:
FIG. 4 is a circuit diagram of a modified version of the bandpass filter in FIG. 1.
Figure 4:
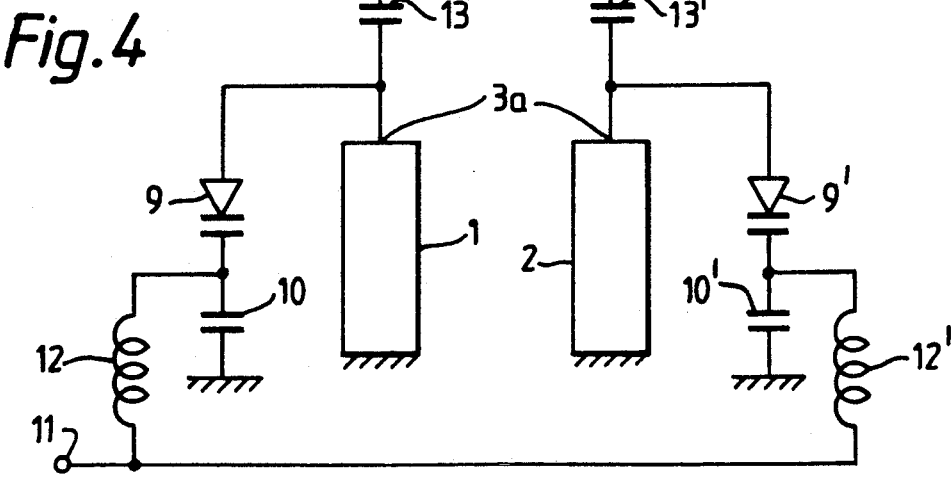

The filter shown in FIG. 4 is a modification of the FIG. 2 circuit in which a zero or "notch" is introduced into the transmission response at the frequency where attenuation needs to be enhanced. This is achieved by incorporating a respective capacitor 13,13' in series with the resonators 1,2. Thus, one terminal of the capacitor 13 is coupled to the anode of varactor 9 and also to the open-circuit end $3a$ of resonator 1 and the other terminal is coupled between the capacitors 5 and 14. Similarly one terminal of capacitor 13' is coupled to the anode of varactor 9, and also to the open-circuit end $3a$ of resonator 2 and the other terminal is coupled between capacitors 7 and 14. In this embodiment the capacitors 5 and 7 were chosen to have a capacitance of 0.35 pF, and the zero-controlling capacitors 13 and 13' had a capacitance of 3.9 pF. The other components had the same values as in the previous embodiment. The 3.9 pF series capacitors 13 and 13' were found to be the optimum value to locate the zero close to 45 MHz below the passband. The rejection is about 45 dB at this value.

It is noted here that if the capacitors 13 and 13' in the FIG. 4 circuit are replaced by inductors then the transmission zero will be located above the passband.

Figure 5:
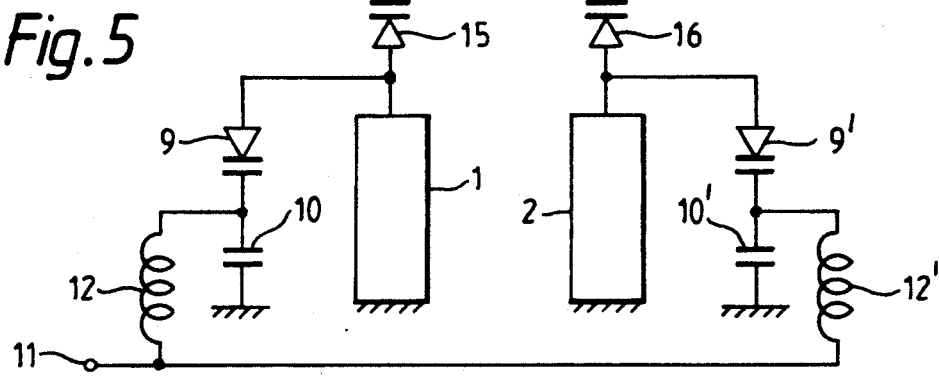
FIG. 5 is a circuit diagram of a modified version of the bandpass filter in FIG. 4.

FIG. 5 shows a modified version of the FIG. 4 circuit, in which the series connected capacitors 13, 13' are substituted by respective varactors 15, 16. The varactors 15, 16 which may be the same Toshiba 1SV214 varactors used for the varactors 9 and 9' as discussed previously, enable the location of the zero to be controlled so that it can be placed at exactly the desired location e.g. exactly 45 MHz below the pass band. The cathode of the varactors 15 and 16 are coupled to respective series connected resistors 17, 18 which in turn are coupled to a common voltage source terminal 19. In an alternative arrangement the cathode of the varactors 15 and 16 could be coupled to different voltage source terminals whereby the varactors 15 and 16 may be controlled independently. The resistors 17 and 18 help to prevent any RF signal leaking to the terminal 19. The value of the resistors 17 and 18 is 100 kohms. In this embodiment the filter bandwidth is widened to reduce the insertion loss by increasing the capacitance of the resonator coupling capacitor 14 to 0.7 pF. This filter provides about 55 dB rejection and 3.4 dB insertion loss across the tuning range 881 to 917 MHz. The filter bandwidth is approximately 14 MHz. The tuning voltage required to cover this range is 14 to 30.1 V for the pole (passband) locations on terminal 11, and 11.3 to 12.8 V for the zero (reject bands) on terminal 19.

Figure 6:
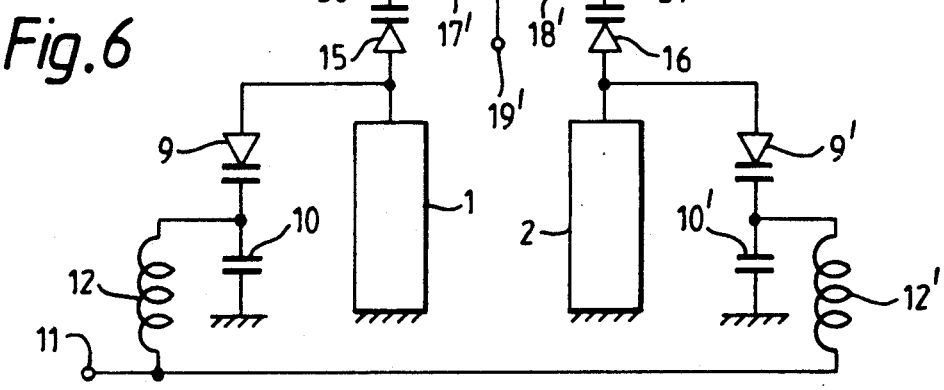
FIG. 6 is a circuit diagram of a modified version of the bandpass filter in FIG. 5.

FIG. 6 shows a modified version of the FIG. 5 circuit adapted to operate with lower varactor voltages (higher varactor capacitance). Firstly, the capacitance value of capacitor 10 which provides the RF ground for the pole-tuning varactors 9 is reduced to 1.7 pF. Secondly, an additional 5.6 pF capacitor 20, 21 is coupled in series to the cathode of the zero controlling varactors 15, 16 respectively. These capacitors 20, 21 are effective to limit the amount of RF voltage present across the associated varactor 15, 16.

Figure 7:
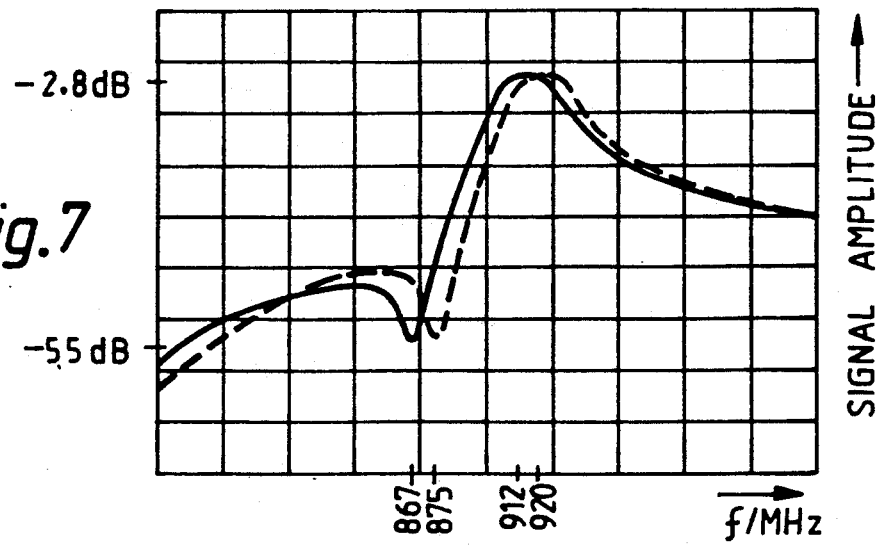
FIG. 7 is a graph showing the performance of the bandpass filter in FIG. 6.

As before the cathode of the varactors is coupled to a common voltage source terminal 19' via respective resistors 17' and 18'. Alternatively the cathode of the varactors 15 and 16 may be coupled to different voltage source terminals via the respective resistors 17' and 18' if it is required for the varactors to be controlled independently. Again the resistors 17, and 18' help to prevent any RF signal leaking to the terminal 19'. The performance of this circuit is illustrated by the filter characteristics shown in FIG. 7. The tuning range of this circuit is 912 to 920 MHz. The solid line plot shows the performance of the circuit tuned to a receive frequency of 912 MHz, with the zero tuned to be located at 867 MHz. In this case the voltage applied on terminal 19, was 0.4 V and the voltage applied on terminal 11 was 0.5 V. The broken line plot shows the performance of the circuit tuned to a receive frequency of 920 MHz, with the zero tuned to be located at 875 MHz. In this case the voltage applied on terminal 19' was 1.6 V and the voltage applied on terminal 11 was 4.0 V. The insertion loss is improved compared with the previous embodiment and is approximately 2.8 dB across the entire tuning range. The rejection remains substantially the same as in the previous embodiment at about 55 dB. It is noted here that the tuning range can be extended further. For example, by increasing the voltage on terminal 19' to 3.8 V and applying the same voltage of 4.0 V on terminal 11 the notch can be located at 880 MHZ and the passband centered on 925 MHz.

Figure 8:
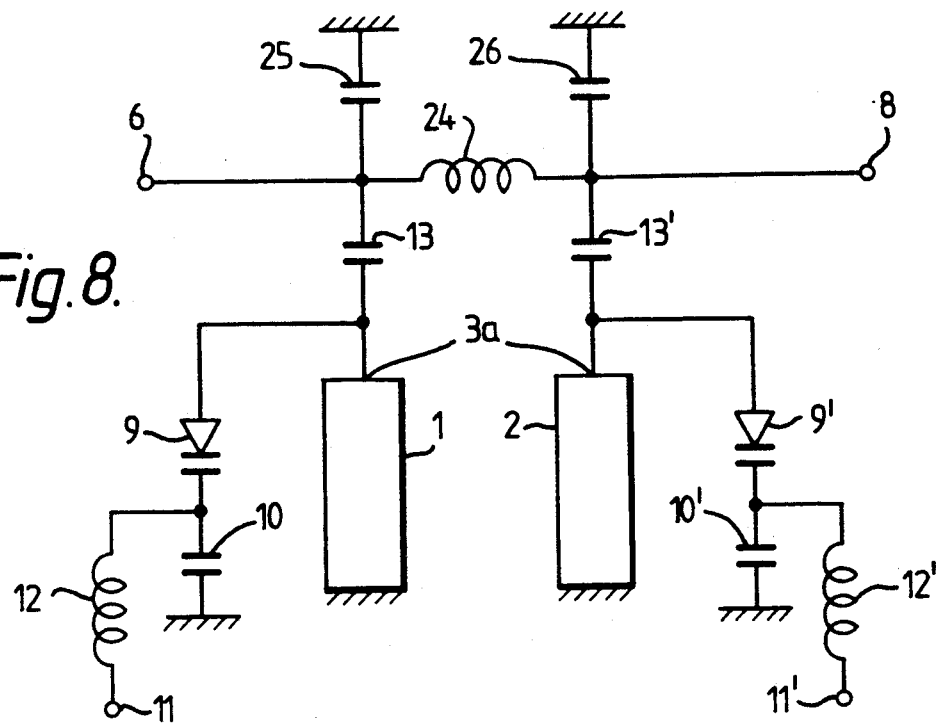
FIG. 8 is a circuit diagram of a bandstop filter in accordance with the present invention.
Figure 9:
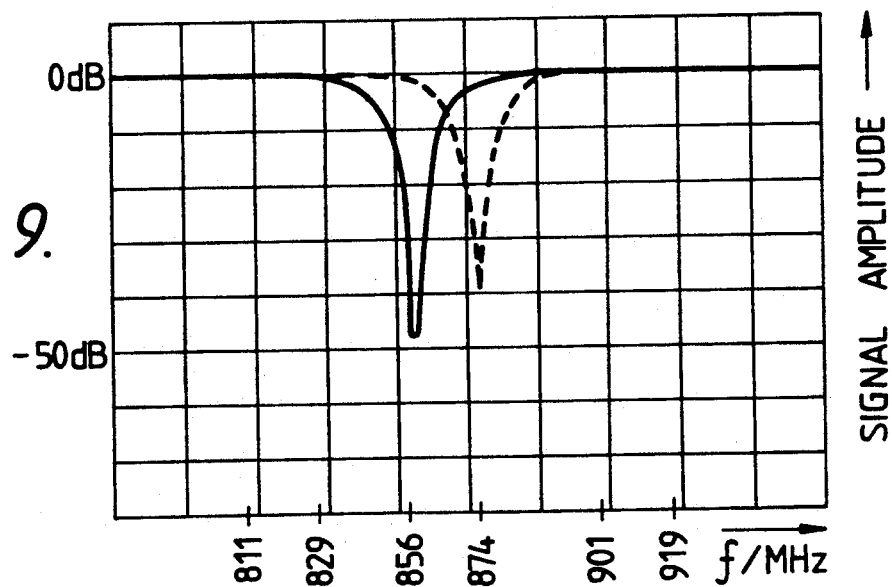
FIG. 9 is a graph showing the performance of the bandstop filter in FIG. 8.

Turning now to FIG. 8 there is shown a two pole bandstop filter. The resonators 1,2 are reactively coupled to a 8 nH inductor. A respective 1.2 pF capacitor 13,13' is connected in series with the resonators 1,2. One terminal of the capacitor 13 is coupled to a point between the anode of varactor 9 and also to the open-circuit end 3a of resonator 1 and the other terminal is coupled between the input terminal 6 and the inductor 24. Similarly one terminal of capacitor 13' is coupled to a point between the anode of varactor 9' and also to the open circuit end 3a of resonator 2 and the other terminal is coupled between the inductor 24 and the output terminal 8. A 4 pF capacitor 25 coupled to ground potential is also connected to a point between the capacitor 13 and the inductor 24, and a 4 pF capacitor 26 coupled to ground potential is similarly connected to a point between the inductor 24 and capacitor 13'. In this bandstop embodiment the cathode of varactors 9 and 9' are coupled via the respective inductors 12 and 12' to different control voltage terminals 11 and 11' respectively whereby the varactors 9 and 9' can be controlled independently of each other. The performance of this circuit is illustrated by the filter characteristics shown in FIG. 9. It can be seen that a relatively narrow notch can be located at a desired frequency between 856 and 874 MHz. The solid line plot shows the performance of the filter tuned to a frequency of 856 MHz and the broken line plot shows the performance of the circuit tuned to a frequency of 874 MHz. At 856 MHz the control voltages used are 0.8 V on terminal 11 and 1.0 V on terminal 11'. At 874 MHz the control voltages are 4.0 V on terminal 11 and 2.7 V on terminal 11, The rejection is approximately 46 dB at 856 MHz and 39 dB at 874 MHz and the insertion loss (at ±45 MHz) is 0.6 dB.

In view of the foregoing description it will be evident to a person skilled in the art that various modifications may be made within the scope of the invention. For example various component values may be selected depending on the filtering performance requirements. Indeed, the filter of the present invention may have the bandstop or bandpass located substantially above or below 900 MHz, for example at 1.8 GHz. Moreover the invention is not restricted to dielectric coaxial resonators, but other reactively coupled quarter wavelength resonators may be used for example a helical, microstrip, or stripline resonator. The capacitive coupling between the resonators need not be effected by discrete capacitors as described above. Instead, where a monolithic dielectric block approach is employed to implement the resonators, for example, apertures may be included between the individual resonators to provide the coupling or coupling electrodes may be provided on the open-end face of the dielectric block. Furthermore, a filter in accordance with the invention may comprise more than two resonators. It is not necessary for each of these resonators to be tunable. On the contrary it may be sufficient for only one or selected ones of the total number of resonators to have tuning means coupled thereto. For example in the case of a three pole device, one, two or all three of the resonators may be provided with tuning means. Moreover, the respective tuning means may be arranged for individual or common adjustment.

I claim:

1. A filter for selectively attenuating a range of radio frequency signals, including
    at least two inductively coupled coaxial resonators comprising inner and outer conductors,
    tuning means coupled to the inner conductor of at least one of said resonators for adjusting the range of frequencies attenuated by the filter, and
    means for applying a control signal to said tuning means,
    wherein the range of frequencies attenuated by the filter is adjusted by said tuning means in response to the control signal applied thereto.

2. A filter as claimed in claim 1, wherein said at least two resonators comprise respective transmission line devices.

3. A filter as claimed in claim 2, wherein the transmission line devices comprise respective coaxial dielectric resonators.

4. A filter as claimed in claim 1, wherein the tuning means are coupled electrically in parallel with the respective resonators.

5. A filter as claimed in claim 1, wherein each resonator has respective first and second ends, the first end of each resonator being coupled to a common potential.

6. A filter as claimed in claim 5, including a capacitor having one terminal coupled to the tuning means and the other terminal coupled to said common potential.

7. A filter as claimed in claim 1, wherein the tuning means comprise respective variable capacitance diodes.

8. A filter for selectively passing a passband of radio frequency signals, comprising:
    at least two reactively coupled coaxial resonators having inner and outer conductors,
    tuning means coupled to the inner conductor of at least one of said resonators for adjusting the range of frequencies passed by the filter,
    means for applying a control signal to said tuning means; and
    reactive means coupled to at least one of said resonators for attenuating over a range of frequencies outside the passband wherein the range of frequencies passed by the filter is adjusted by said tuning means in response to the control signal applied thereto.

9. A filter as claimed in claim 8, wherein the reactive means are adapted to adjust the range of frequencies attenuated by said reactive means in response to a control signal applied thereto.

10. A filter as claimed in claim 9, wherein the reactive means are coupled electrically in series with the respective resonators.

11. A filter as claimed in claim 8, wherein the reactive means comprise respective variable capacitance diodes.

12. A filter for selectively attenuating a range of radio frequency signals, including
    at least two inductively coupled coaxial dielectric resonators comprising inner and outer conductors,
    tuning means coupled to the inner conductor of at least one of said resonators for adjusting the range of frequencies attenuated by the filter, and
    means for applying a control signal to said tuning means,
    wherein the range of frequencies attenuated by the filter is adjusted by said tuning means in response to the control signal applied thereto.

13. A filter as claimed in claim 12, wherein the tuning means are coupled electrically in parallel with the respective resonators.

14. A filter as claimed in claim 12, wherein each resonator has respective first and second ends, the first end of each resonator being coupled to a common potential.

15. A filter as claimed in claim 14, including a capacitor having one terminal coupled to the tuning means and the other terminal coupled to said common potential.

16. A filter as claimed in claim 12, wherein the tuning means comprise respective variable capacitance diodes.

17. A filter for selectively passing a passband of radio frequency signals, comprising:
    at least two reactively coupled coaxial dielectric resonators comprising inner and outer conductors;
    tuning means coupled to the inner conductor of at least one of said resonators for adjusting the range of frequencies passed by the filter;
    means for applying a control signal to said tuning means; and
    reactive means coupled to at least one of said resonators for attenuating over a range of frequencies outside the passband wherein the range of frequencies passed by the filter is adjusted by said tuning means in response to the control signal applied thereto.

18. A filter as claimed in claim 17, wherein the reactive means are adapted to adjust the range of frequencies attenuated by said reactive means in response to a control signal applied thereto.

19. A filter as claimed in claim 18, wherein the reactive means are coupled electrically in series with the respective resonators.

20. A filter as claimed in claim 17, wherein the reactive means comprise respective variable capacitance diodes.

21. A filter as in claim 1 wherein each resonator has a respective tuning means and wherein said means for applying a control signal to said tuning means is adapted to apply a separate control signal to each of said respective tuning means.

22. A filter as in claim 8 wherein each resonator has a respective tuning means and wherein said means for applying a control signal to said tuning means is adapted to apply a separate control signal to each of said respective tuning means.

23. A filter as in claim 12 wherein each resonator has a respective tuning means and wherein said means for applying a control signal to said tuning means is adapted to apply a separate control signal to each of said respective tuning means.

24. A filter as in claim 17 wherein each resonator has a respective tuning means and wherein said means for applying a control signal to said tuning means is adapted to apply a separate control signal to each of said respective tuning means.

* * * * *